(12) United States Patent
Anderson et al.

(10) Patent No.: US 6,969,659 B1
(45) Date of Patent: Nov. 29, 2005

(54) FINFETS (FIN FIELD EFFECT TRANSISTORS)

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,909

(22) Filed: Aug. 12, 2004

(51) Int. Cl.$^7$ ............................................. H01L 21/336
(52) U.S. Cl. ...................... 438/281; 438/595; 257/346
(58) Field of Search ................................ 438/230, 276, 438/281, 287, 303, 592, 595, 981; 257/346, 257/347

(56) References Cited

U.S. PATENT DOCUMENTS

| | | | |
|---|---|---|---|
| 6,642,115 B1 | 11/2003 | Cohen et al. | |
| 6,855,582 B1 * | 2/2005 | Dakshina-Murthy et al. | 438/157 |
| 2002/0093053 A1 | 7/2002 | Chan et al. | |
| 2002/0140039 A1 | 10/2002 | Adkisson et al. | |
| 2002/0177263 A1 | 11/2002 | Hanafi et al. | |
| 2002/0192911 A1 | 12/2002 | Parke | |
| 2002/0197781 A1 | 12/2002 | Bryant et al. | |
| 2003/0057486 A1 | 3/2003 | Gambino et al. | |
| 2003/0102518 A1 | 6/2003 | Fried et al. | |
| 2003/0178681 A1 | 9/2003 | Clark et al. | |
| 2003/0193070 A1 | 10/2003 | Chan et al. | |
| 2003/0211684 A1 * | 11/2003 | Guo | 438/230 |
| 2004/0036118 A1 | 2/2004 | Abadeer et al. | |

* cited by examiner

*Primary Examiner*—Phuc T. Dang
(74) *Attorney, Agent, or Firm*—Schmeiser, Olsen & Watts; William D. Sabo

(57) ABSTRACT

A FinFET structure that prevents parasitic electrical leakages between its gate region and its fin region and between its gate region and its epitaxial region (source/drain regions). The structure is formed by first forming a fin region on top of an electrically insulating layer. Next, a gate stack having gate spacers thereon is formed on top of and electrically insulated from the fin region. Then, the final S/D (source/drain) regions are formed by epitaxially growing a semiconductor material from the two ends of the fin region not covered by the gate stack. Next, another electrically insulating layer is formed on top of the structure except the gate spacers. Next, the gate spacers and portions of the gate stack beneath them are replaced with a dielectric material.

20 Claims, 7 Drawing Sheets

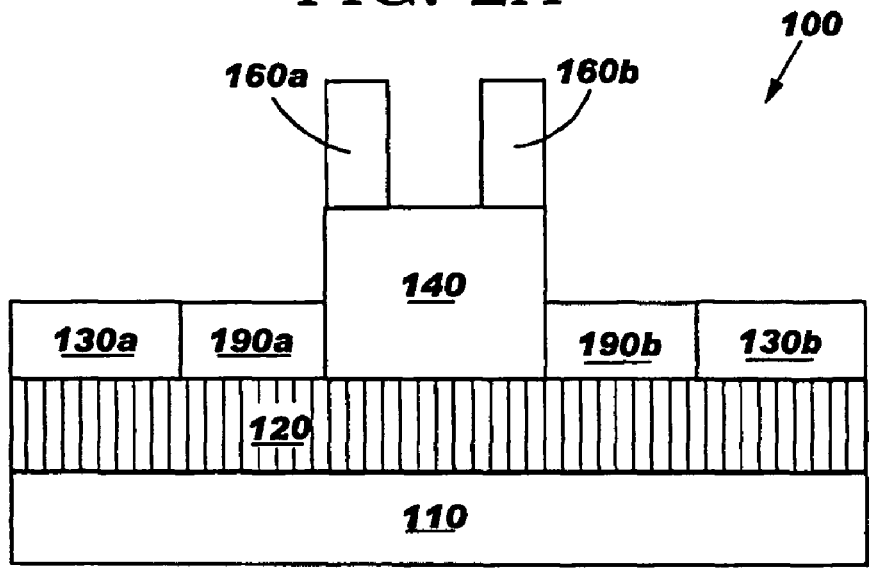
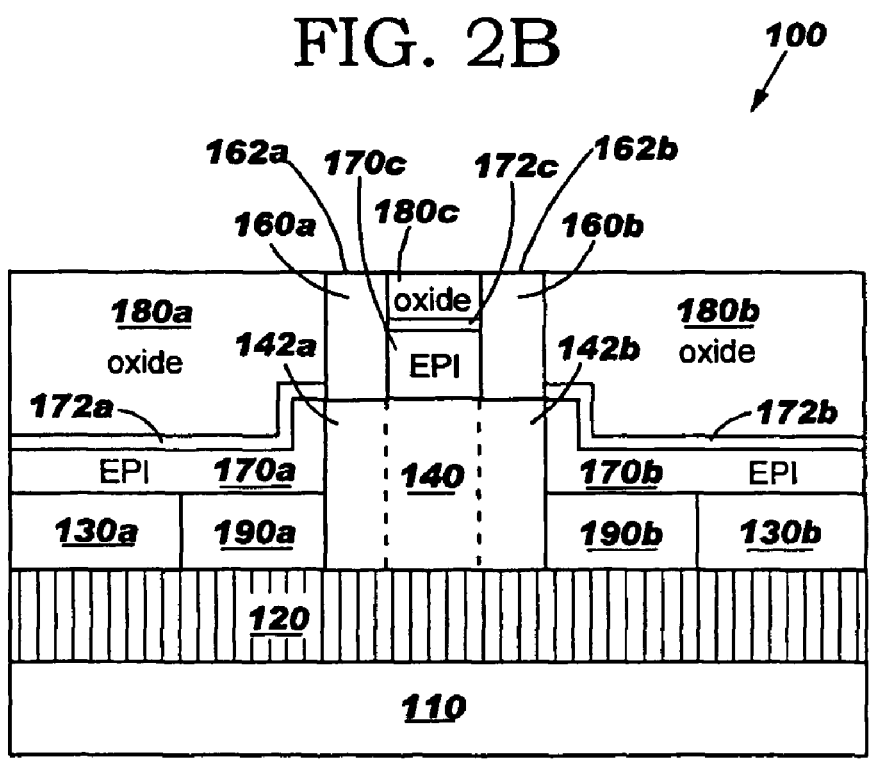

FINFETS (FIN FIELD EFFECT TRANSISTORS)

BACKGROUND ART

1. Technical Field

The present invention relates to FinFETs (Fin Field Effect Transistors), and more particularly, to methods for fabricating FinFETs.

2. Related Art

FinFET (Fin Field Effect Transistor) technology utilizes thin fin regions which are susceptible to high resistance. In order to reduce series resistance between the portion of a fin region under the gate region and a source/drain region of a FinFET, selective epitaxial growth of a semiconductor material is typically performed on the portions of the fin region not covered by the gate region. However, this epitaxial growth can cause parasitic electrical leakages between the gate region and the fin region and between the gate region and the epitaxial region of the FinFET.

Therefore, there is a need for a method for fabricating a FinFET that prevents parasitic electrical leakages between the gate region and the fin region and between the gate region and the epitaxial region of the FinFET.

SUMMARY OF THE INVENTION

The present invention provides a method for fabricating a semiconductor structure, the method comprising the steps of (a) providing a semiconductor channel region in a semiconductor substrate; (b) forming a gate dielectric layer on top of the semiconductor channel region; (c) forming a gate stack on top of the gate dielectric layer, wherein the gate stack is electrically isolated from the semiconductor channel region by the gate dielectric layer, wherein the gate stack comprises (i) a gate region on top of the gate dielectric layer, and (ii) a gate stack mask on top of the gate region, wherein the gate stack mask comprises a gate mandrel and first and second gate spacers, and wherein the gate mandrel is sandwiched between the first and second gate spacers; (d) forming first and second source/drain regions in the substrate using the gate stack as an alignment mask; (e) removing the first and second gate spacers; (f) removing portions of the gate region beneath the removed first and second gate spacers; and (g) filling a dielectric side plate material into spaces of the removed first and second gate spacers and the removed portions of the gate region beneath the removed first and second gate spacers so as to form first and second gate dielectric side plates.

The present invention also provides a method for fabricating a semiconductor structure, the method comprising the steps of (a) providing a semiconductor channel region in a semiconductor substrate; (b) forming a gate dielectric layer on top of the semiconductor channel region; (c) forming a gate stack on top of the gate dielectric layer, wherein the gate stack is electrically isolated from the semiconductor channel region by the gate dielectric layer, wherein the gate stack comprises (i) a gate region on top of the gate dielectric layer, and (ii) and a gate stack mask on top of the gate region, wherein the gate stack mask comprises a gate mandrel and first and second gate spacers, and wherein the gate mandrel is sandwiched between the first and second gate spacers; (d) removing the first and second gate spacers; (e) removing portions of the gate region beneath the removed first and second gate spacers; and (f) filling a dielectric side plate material into spaces of the removed first and second gate spacers and the removed portions of the gate region beneath the removed first and second gate spacers so as to form first and second gate dielectric side plates.

The present invention also provides a semiconductor structure, comprising (a) a semiconductor channel region; (b) a gate dielectric region being on top of the semiconductor channel region; (c) a gate region being on top of the gate dielectric region and being electrically isolated from the semiconductor channel region by the gate dielectric region; and (d) first and second gate dielectric side plates being on top of the gate dielectric region and being on side walls of the gate region, wherein the gate region is sandwiched between first and second gate dielectric side plates, and wherein a top surface of the gate region is lower than top surfaces of the first and second gate dielectric side plates.

The present invention provides a method for fabricating a FinFET that prevents parasitic electrical leakages between the gate region and the fin region and between the gate region and the epitaxial region of the FinFET.

BRIEF DESCRIPTION OF THE DRAWINGS

FIGS. 2A–2C illustrate the semiconductor structure of FIG. 1 along surface 2 going through steps of the fabrication method of the present invention, in accordance with embodiments of the present invention.

DISCLOSURE OF INVENTION

Figure 1:
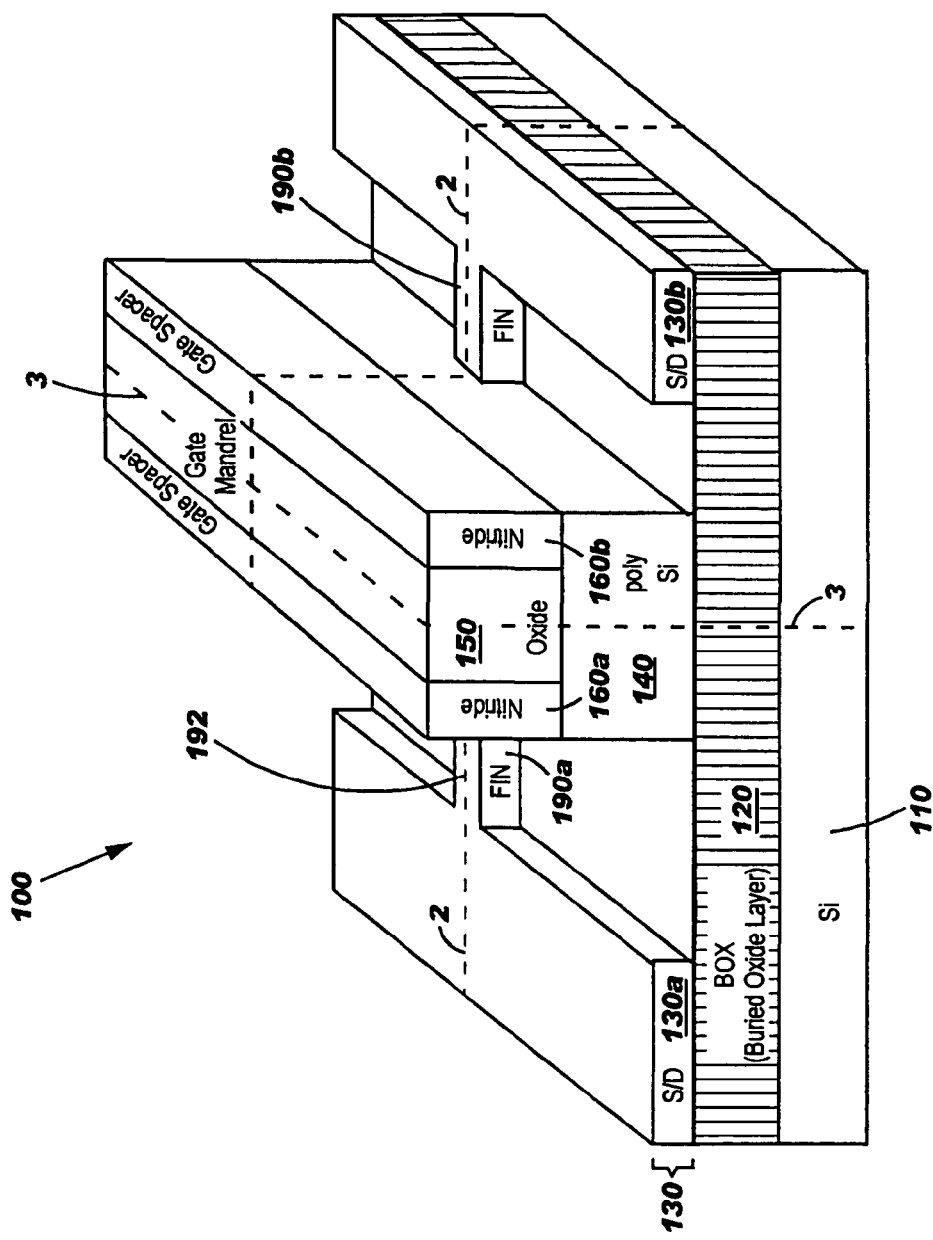
FIG. 1 is a perspective view of a semiconductor structure used to illustrate a fabrication method of the present invention, in accordance with embodiments of the present invention.

FIG. 1 is a perspective view of a semiconductor structure 100 used to illustrate a fabrication method of the present invention, in accordance with embodiments of the present invention. In one embodiment, the method starts out with the step of providing a semiconductor layer 110, an electrically insulating layer 120 on top of the semiconductor layer 110, and another semiconductor layer 130 on top of the electrically insulating layer 120. In one embodiment, each of the semiconductor layers 110 and 130 can independently comprise semiconductor materials such as silicon and germanium, etc. In one embodiment, the combination of the layers 110, 120, and 130 can be an SOI (Silicon-on-Insulator) substrate. In one embodiment, the electrically insulating layer 120 comprises silicon dioxide ($SiO_2$) and, in which case the electrically insulating layer 120 is referred to as a BOX (Buried Oxide) layer.

Next, portions of the semiconductor layer 130 is etched away so as to form a fin region 190 (comprising fin region portions 190a, 190b, and 190c wherein the fin region portion 190c is disposed between the fin region portions 190a and 190b and is not shown in FIG. 1 because it is later buried in another component of the structure 100) and source/drain regions 130a and 130b. More specifically, in one embodiment, a photo resist layer (not shown) is formed on top of the semiconductor layer 130 and is then patterned via lithography to cover only portions of the semiconductor layer 130 that will become the fin region 190 and the source/drain regions 130a and 130b. Then, portions of the semiconductor layer 130 not covered by the patterned photo resist layer is etched away by, illustratively, dry etching leaving the fin region 190 and source/drain regions 130a and 130b on top of the electrically insulating layer 120.

Figure 3A:
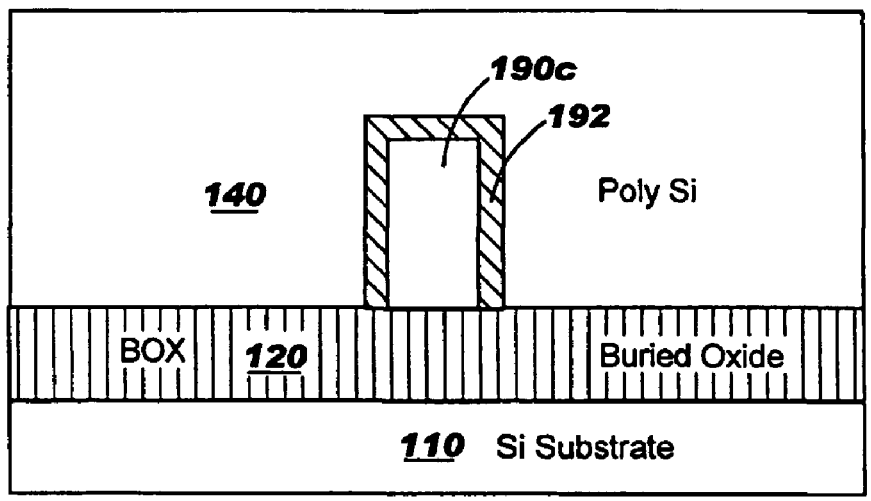
FIGS. 3A–3B illustrate the semiconductor structure of FIG. 1 along surface 3 going through steps of the fabrication method of the present invention, in accordance with embodiments of the present invention.

Next, in one embodiment, the patterned photo resist layer is removed, and then an electrically insulating layer 192 (not shown distinctly from the fin region 190 in FIG. 1, but can be seen distinctly from the fin region portion 190c in FIGS. 3A and 3B) is formed on top and side walls of the fin region 190. In one embodiment, the electrically insulating layer 192 can be formed by thermally oxidizing exposed silicon surfaces of the structure 100. As a result, silicon dioxide (which is electrically insulating) is formed on top and side walls of the fin region 190 and the source/drain regions 130a and 130b. As a result, the fin region 190 is electrically insulated from other components which will be later formed upon it.

It should be noted that, in some alternative embodiments, the formation of the fin region 190 involves the formation of a hard mask layer (now shown) directly on top of the semiconductor layer 130. Then the photo resist layer is formed on top of the hard mask layer. The hard mask layer can comprise a pad oxide layer (not shown) formed directly on top of the semiconductor layer 130. Next, the photo resist layer is patterned. Then, the hard mask layer is patterned accordingly. Next, portions of the semiconductor layer 130 not covered by the patterned photo resist layer and hard mask layer is etched away by, illustratively, dry etching leaving the fin region 190 and source/drain regions 130a and 130b on top of the electrically insulating layer 120. Next, the patterned photo resist layer and the hard mask layer (except for the pad oxide layer) are removed leaving the fin region 190 and source/drain regions 130a and 130b on top of the electrically insulating layer 120. Then, the electrically insulating layer 192 can be formed by thermally oxidizing exposed silicon surfaces of the structure 100 (i.e., side walls of the fin region 190 and source/drain regions 130a and 130b).

Next, in one embodiment, a gate stack 140, 150, 160 (i.e., comprising regions 140, 150, and 160a and 160b) is formed on top of the structure 100 such that the fin region portion 190c of the fin region 190 is completely buried in the gate stack 140, 150, 160, and the fin region portions 190a and 190b of the fin region 190 are not buried in the gate stack 140, 150, 160.

In one embodiment, the gate stack 140, 150, 160 comprises a gate region 140, a gate mandrel 150, and gate spacers 160a and 160b. In one embodiment, the gate region 140 can comprise an electrically conducting material such as polysilicon. The gate mandrel 150 can comprise $SiO_2$, and the gate spacers 160a and 160b can comprise a nitride (e.g., silicon nitride). The gate mandrel 150 is sandwiched between the two gate spacers 160a and 160b. In one embodiment, the fin region portion 190c of the fin region 190 is completely buried in the gate region 140 of the gate stack 140, 150, 160.

In one embodiment, the formation of the gate stack 140, 150, 160 can start with the formation of a gate region layer (not shown, but which comprises the gate region 140) on top of the entire structure 100 (therefore, completely burying the electrically insulated fin region 190). Then, a gate mandrel layer (not shown, but which comprises the gate mandrel 150) is formed on top of the gate region layer. Then, the gate mandrel layer is patterned (using illustratively lithography) into the gate mandrel 150 on top of the gate region layer. Then, the gate spacers 160a and 160b are formed on side walls of the gate mandrel 150. More specifically, in one embodiment, the gate spacers 160a and 160b can be formed on side walls of the gate mandrel 150 by forming a gate spacer layer (not shown, but which comprises the gate spacers 160a and 160b) entirely on top of the gate mandrel 150 and the gate region layer and then etching back of the gate spacer layer is performed. What are left of the gate spacer layer after etching back are the gate spacers 160a and 160b on side walls of the gate mandrel 150. Next, in one embodiment, the gate stack mask 150, 160 (comprising the gate mandrel 150 and the gate spacers 160a and 160b) can be used as a mask in etching away portions of the gate region layer not covered by the gate stack mask 150, 160. What is left of the gate region layer after this etching is the gate region 140. At this point, the formation of the gate stack 140, 150, 160 is complete.

Next, in one embodiment, an implant step can be performed to dope the fin region portions 190a and 190b and the S/D (Source/Drain) regions 130a and 130b.

Next, in one embodiment, portions of the electrically insulating layer 192 covering top and side walls of the fin region portions 190a and 190b and the S/D regions 130a and 130b are removed. In one embodiment, both the electrically insulating layer 192 and the mandrel 150 comprise $SiO_2$ so that the mandrel 150 and the portions of the electrically insulating layer 192 covering the fin region portions 190a and 190b and the S/D regions 130a and 130b can be simultaneously removed using, illustratively, RIE etching (i.e., reactive ion etching). The resulting structure 100 is shown in FIG. 2A (viewed along the plane 2 of FIG. 1) and in FIG. 3A (viewed along the plane 3 of FIG. 1). In an alternative embodiment, this step of removing portions of the electrically insulating layer 192 is performed first, followed by the step of doping the fin region portions 190a and 190b and the S/D regions 130a and 130b (which is mentioned supra).

Figure 4:
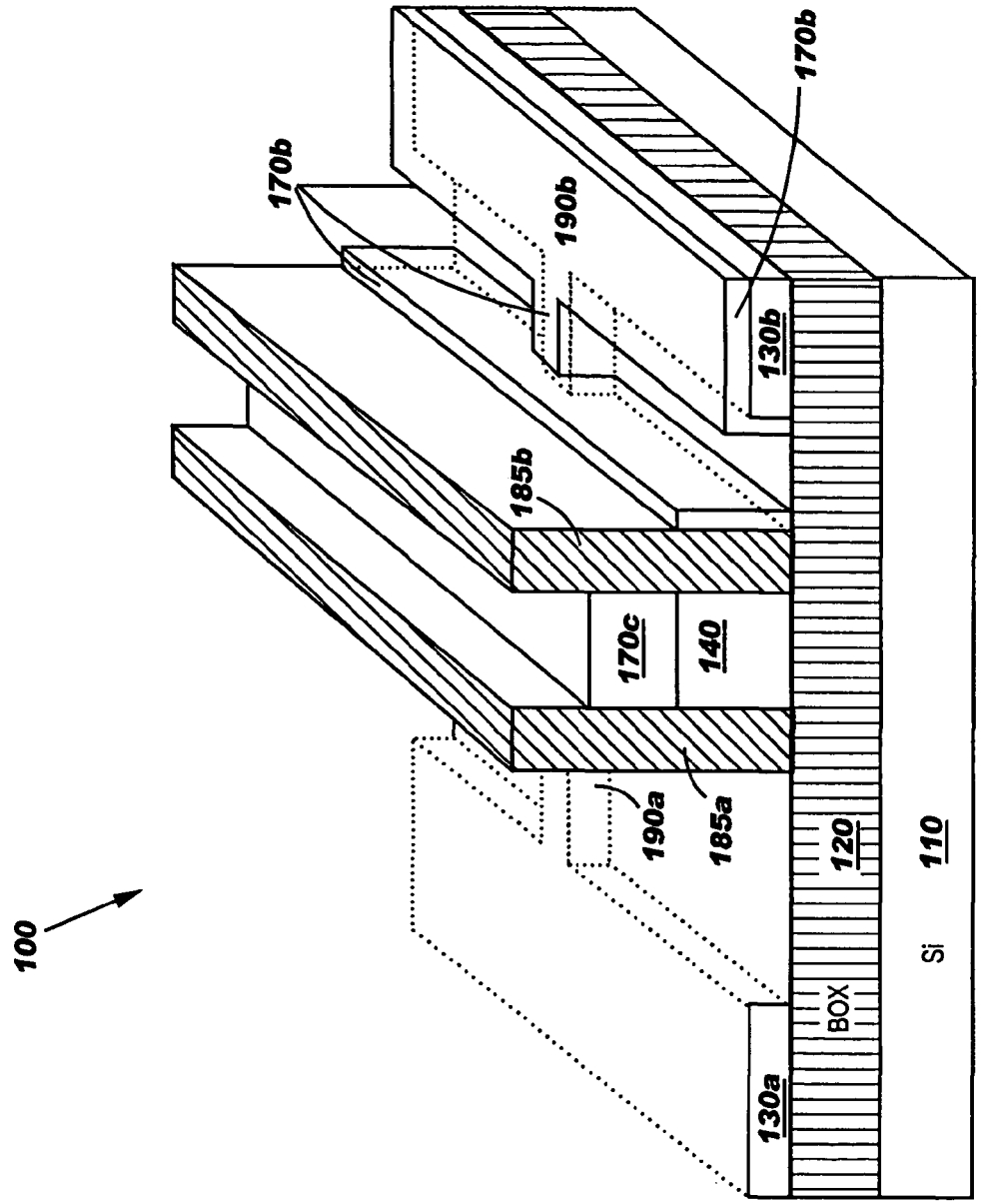
FIG. 4 illustrates some important components of the semiconductor structure of FIG. 1 as the result of the fabrication method of the present invention, in accordance with embodiments of the present invention.

Next, in one embodiment, a semiconductor material (e.g., silicon, germanium, etc.) can be epitaxially grown from the gate region 140, the fin region portions 190a and 190b, and the S/D regions 130a and 130b (FIG. 2B). More specifically, the semiconductor material region 170a epitaxially grown from the gate region 140, the fin region portion 190a, and the S/D region 130a merges with these regions 190a and 130a so as to form a final S/D region 130a, 190a, 170a. Similarly, the semiconductor material region 170b epitaxially grown from the gate region 140, the fin region portion 190b, and the S/D region 130b merges with these regions 190b and 130b so as to form a final S/D region 130b, 190b, 170b. Also, the semiconductor material region 170c epitaxially grown from the gate region 140 merges with the gate region 140 to form the new gate region 140, 170c. FIG. 4 illustrates a perspective view of the structure 100, not at point in time, but after several more fabrication steps (described infra) are performed. However, the new gate region 140, 170c and the final S/D region 130b, 190b, 170b can be seen in FIG. 4. For simplicity, the final S/D region 130a, 190a, 170a and other less important regions (e.g., silicide layer 172, etc.) are not shown in FIG. 4 (although they are present in FIG. 2B). In one embodiment, top surfaces of the EPI (epitaxial) layers 170a, 170b, and 170c (FIG. 2B) are lower than top surfaces 162a and 162b of the gate spacers 160a and 160b, respectively.

Next, in one embodiment, top surfaces of the epitaxially grown (EPI) regions 170a, 170b, and 170c are silicided to form silicide regions 172a, 172b, and 172c, respectively (FIG. 2B). In FIG. 3B, only silicide region 172c of the silicide regions 172a, 172b, and 172c can be seen.

Next, in one embodiment, a third electrically insulating layer (partially shown in FIG. 2B as regions 180a, 180b, and 180c), comprising illustratively $SiO_2$, is formed on top of the entire structure 100 and then is planarized until top surfaces 162a and 162b (FIG. 2B) of the gate spacers 160a and 160b, respectively, are exposed to the atmosphere. What is left of the third electrically insulating layer are the electrically insulating regions 180a, 180b, and 180c on top of the silicide regions 172a, 172b, and 172c, respectively (FIG. 2B). In FIG. 3B, only electrically insulating region 180c of the regions 180a, 180b, and 180c can be seen.

Figure 2C:
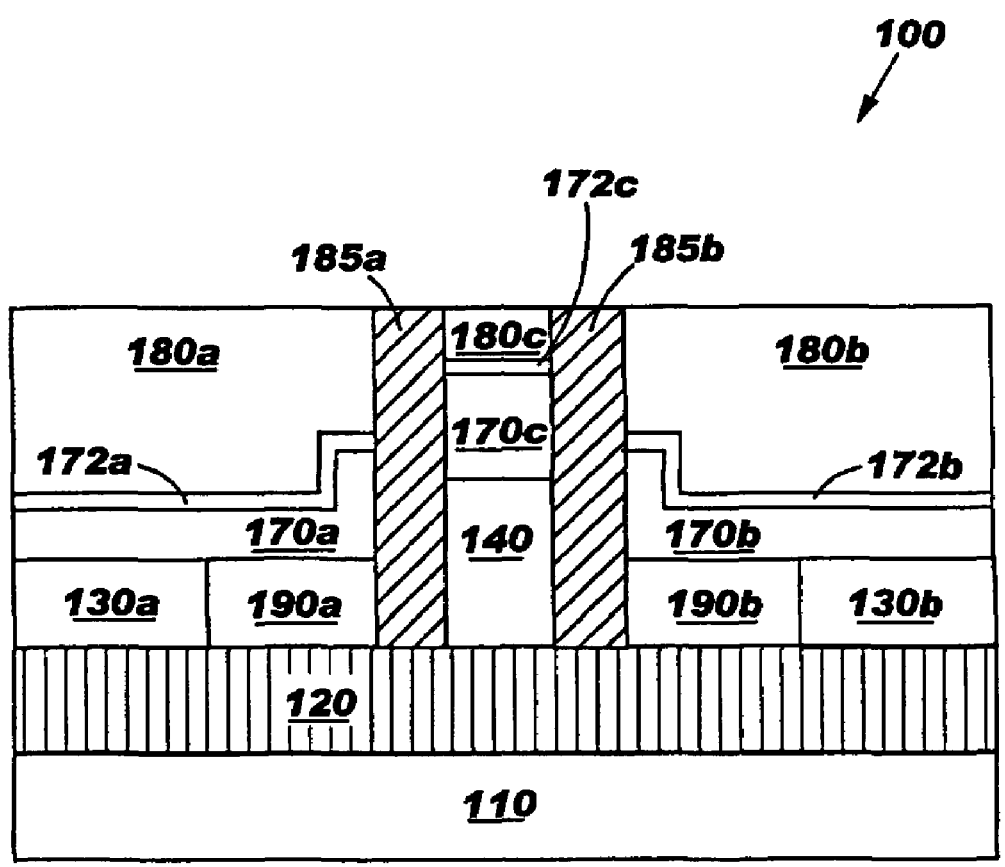
Figure 3B:
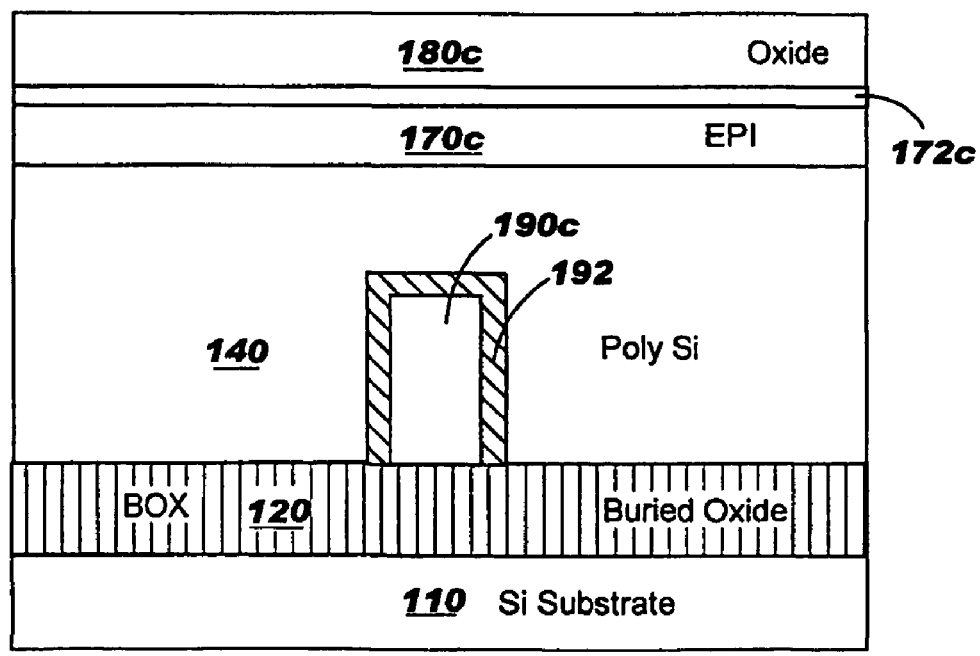

Next, in one embodiment, with reference to FIG. 2B, the gate spacers 160a and 160b are removed by, illustratively, wet etching. Then, the portions 142a and 142b of the gate region 140, 170c directly beneath the removed gate spacers 160a and 160b, respectively, are completely removed by, illustratively, dry etching. Then, the empty spaces of the removed gate spacers 160a and 160b and the removed portions 142a and 142b of the gate region 140, 170c are filled with an electrically insulating material (in one embodiment, a low-K dielectric material with K<3.5, preferably, K<3.0, can be used here as the filling material, wherein K is a dielectric constant) to form gate dielectric side plates 185a and 185b as shown in FIGS. 2C and 4. In one embodiment, the gate dielectric side plates 185a and 185b are uniform in thickness from top to bottom.

In summary, the fabrication of the structure 100 starts out with the fin region 190 and the S/D regions 130a and 130b formed on top of the first electrically insulating layer 120 (FIG. 1). Then, the second electrically insulating layer 192 is formed on top and side walls of the fin region 190 (FIG. 1). Next, the gate stack 140, 150, 160 is formed on top and burying the first fin region portion 190c of the fin region 190 (FIG. 1). Then, the mandrel 150 and the exposed portions of the second electrically insulating layer 192 are removed so as to expose the gate region 140, the fin region portions 190a and 190b, and the S/D regions 130a and 130b to the atmosphere (FIG. 1). Next, silicon is epitaxially grown on top of the structure 100 so as to form the final gate region 140, 170c and the final S/D regions 130a, 170a, 190a and 130b, 170b, 190b. Next, the third electrically insulating layer (comprising regions 180a, 180b, and 180c) is formed on top of the entire structure 100 and then planarized down until the gate spacers 160a and 160b are exposed to the atmosphere (FIG. 2B). Next, the gate spacers 160a and 160b and portions 142a and 142b of gate region 140 beneath the gate spacers 160a and 160b, respectively, are removed and replaced by a dielectric material (preferably, a low-K material) to form the gate dielectric side plates 185a and 185b, respectively (FIGS. 2C and 4).

With reference to FIGS. 2C and 4, the gate dielectric side plate 185a not only electrically isolates the gate region 140, 170c and the S/D region 130a, 170a, 190a but also helps reduce capacitance coupling between them. Similarly, the gate dielectric side plate 185b not only electrically isolates the gate region 140, 170c and the S/D region 130b, 170b, 190b but also helps reduce capacitance coupling between them.

The epitaxially grown regions 170a and 170b help reduce the series resistance between the final S/D regions 130a, 170a, 190a and 130b, 170b, 190b.

Figure 5:
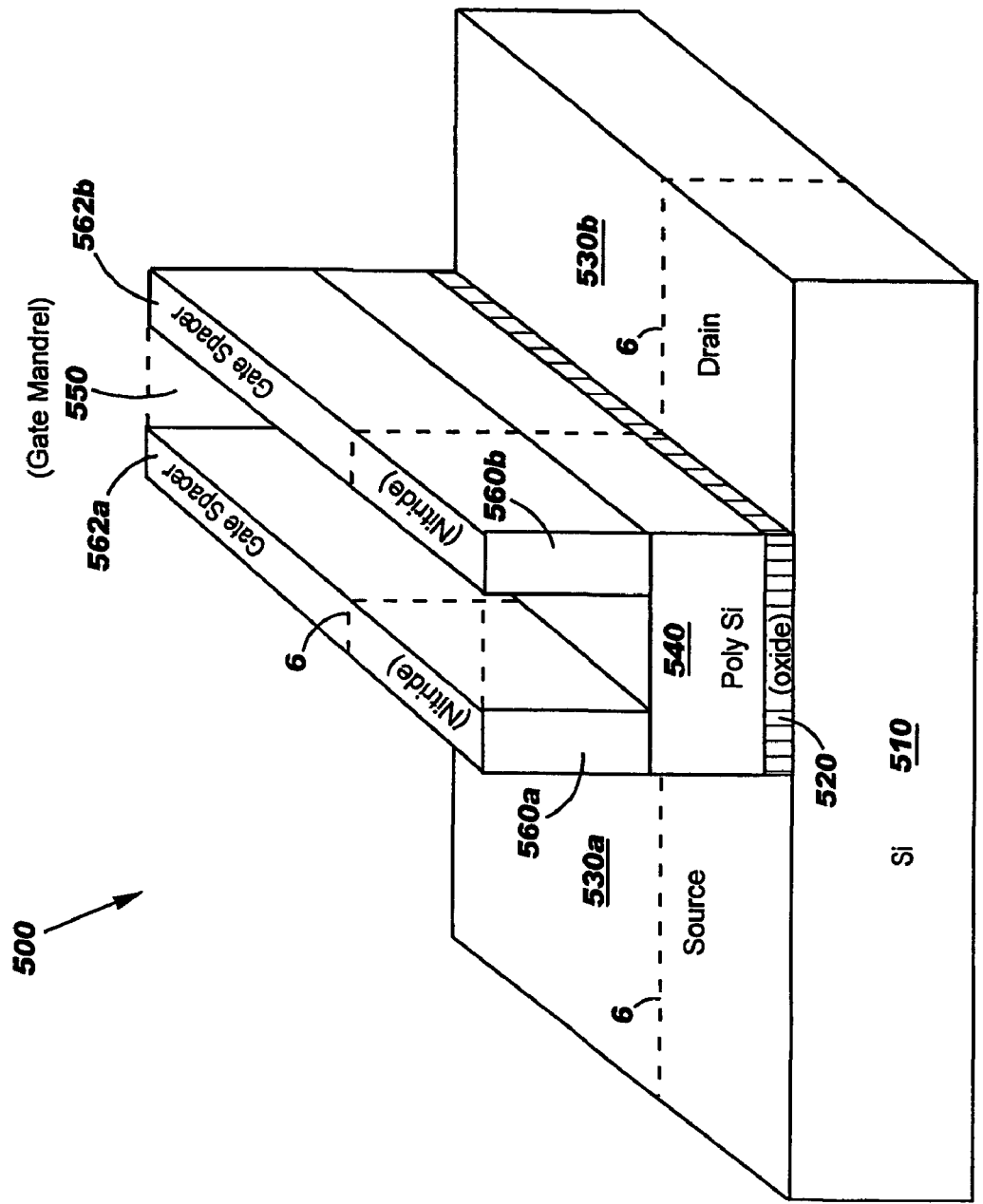
FIG. 5 is a perspective view of another semiconductor structure used to illustrate another fabrication method of the present invention, in accordance with embodiments of the present invention.

FIG. 5 is a perspective view of another semiconductor structure 500 used to illustrate another fabrication method of the present invention, in accordance with embodiments of the present invention. While the structure 100 (FIG. 1) is a FinFET device, the structure 500 (FIG. 5) is planar device. The fabrication of the structure 500 is similar to that of the structure 100 of FIG. 1. More specifically, the fabrication of the structure 500 of FIG. 5 starts with the step of providing a semiconductor (e.g., silicon, silicon-germanium, germanium, etc. . . . ) substrate 510. Then, a gate dielectric layer (not shown entirely) which comprises a gate dielectric region 520 is formed on top of the substrate 510. Then, a gate stack 540, 550, 560 is formed on top of the gate dielectric layer. The structure and the formation of the gate stack 540, 550, 560 are similar to that of the gate stack 140, 150, 160 of FIG. 1. Then, the gate mandrel 550 and portions of the gate dielectric layer not covered by the gate region 540 are removed. FIG. 5 illustrates the structure 500 at this point in time.

Figure 6A:
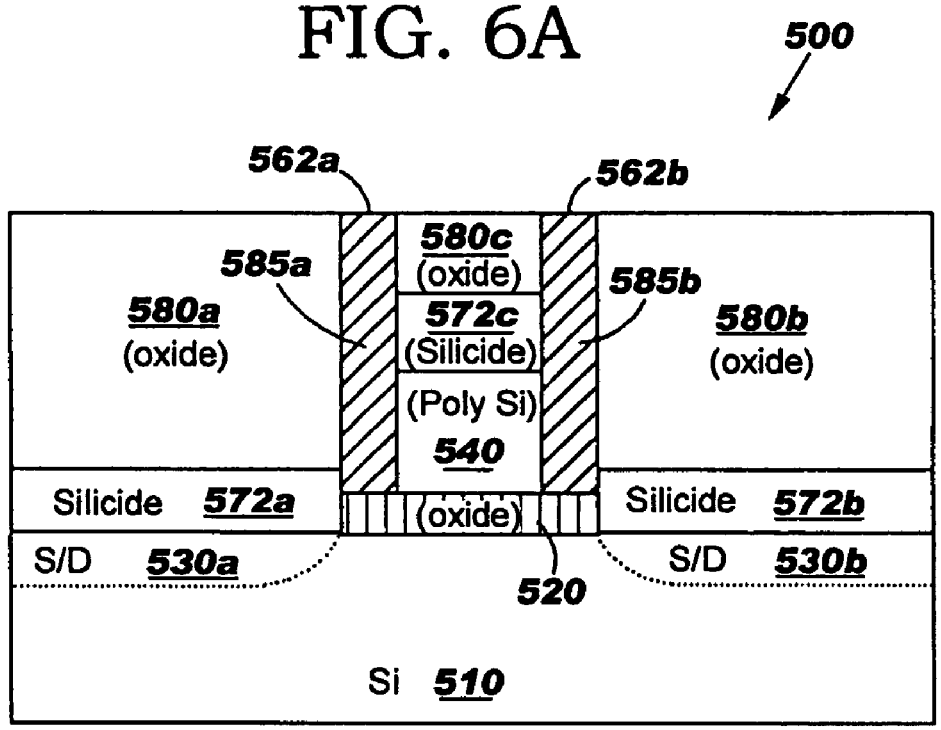
FIG. 6A illustrates the semiconductor structure of FIG. 5 along surface 6 going through steps of the fabrication method of the present invention, in accordance with embodiments of the present invention.

FIG. 6A illustrates the semiconductor structure 500 of FIG. 5 along surface 6 going through steps of the fabrication method of the present invention, in accordance with embodiments of the present invention. More specifically, the S/D regions 530a and 530b can be formed by, illustratively, ion implantation using the gate stack 540, 550, 560 as an alignment mask. Then, a silicide layer 572 (comprising regions 572a, 572b, and 572c) is formed on top of the exposed surfaces of the substrate 510 and the gate region 540. Then, an oxide layer 580 (comprising regions 580a, 580b, and 580c) is formed on top of the entire structure 500, and then is planarized so as to expose top surfaces 562a and 562b of the gate spacers 560a and 560b, respectively (FIG. 5). Then, the gate spacers 560a and 560b are removed, and then portions of the gate region 540 beneath the removed gate spacers 560a and 560b are also removed. The resultant empty spaces are filled with a dielectric material (in one embodiment, a low-K material) so as to form gate dielectric side plates 585a and 585b (FIG. 6A).

Figure 6B:
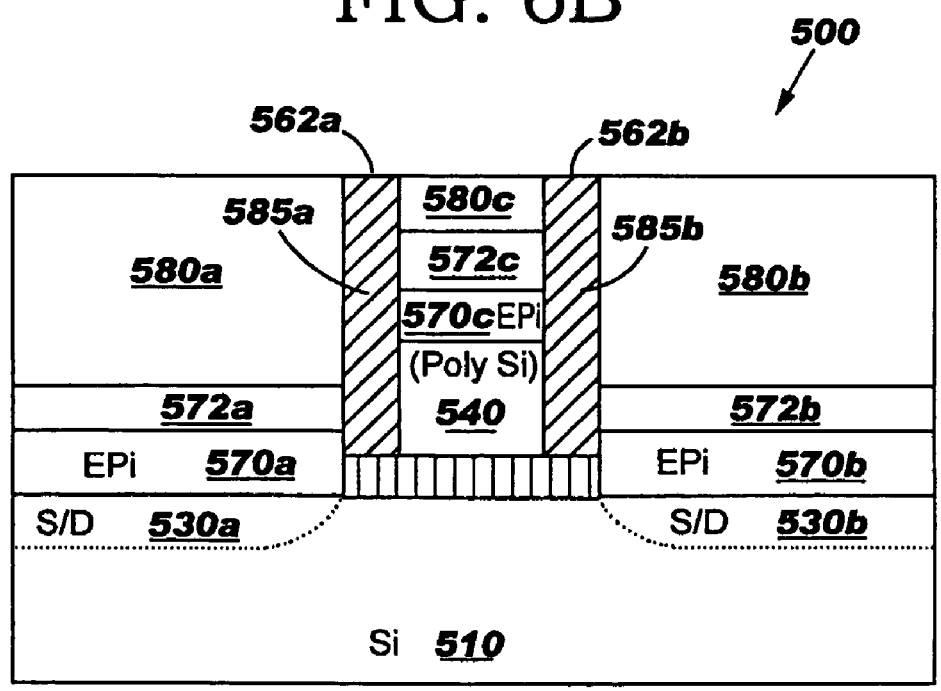
FIG. 6B illustrates the semiconductor structure of FIG. 5 along surface 6 going through steps of the fabrication method of the present invention, in accordance with alternative embodiments of the present invention.

FIG. 6B illustrates the semiconductor structure of FIG. 5 along surface 6 going through steps of the fabrication method of the present invention, in accordance with alternative embodiments of the present invention. The structure 500 of FIG. 6B is similar to that of FIG. 6A, except that an EPI layer 570 (comprising EPI regions 570a, 570b, and 570) is grown on exposed surfaces of the substrate 510 and the gate region 540 before the doping of the S/D regions 530a and 530b is performed.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for fabricating a semiconductor structure, the method comprising the steps of:
   (a) providing a semiconductor channel region in a semiconductor substrate;
   (b) forming a gate dielectric layer on top of the semiconductor channel region;

(c) forming a gate stack on top of the gate dielectric layer,
wherein the gate stack is electrically isolated from the semiconductor channel region by the gate dielectric layer,
wherein the gate stack comprises (i) a gate region on top of the gate dielectric layer, and (ii) a gate stack mask on top of the gate region,
wherein the gate stack mask comprises a gate mandrel and first and second gate spacers, and
wherein the gate mandrel is sandwiched between the first and second gate spacers;
(d) forming first and second source/drain regions in the substrate using the gate stack as an alignment mask;
(e) removing the first and second gate spacers;
(f) removing portions of the gate region beneath the removed first and second gate spacers; and
(g) filling a dielectric side plate material into spaces of the removed first and second gate spacers and the removed portions of the gate region beneath the removed first and second gate spacers so as to form first and second gate dielectric side plates.

2. The method of claim 1, wherein the semiconductor channel region comprises a fin region formed on top of a buried dielectric layer.

3. The method of claim 1, wherein the semiconductor channel region is at a lower level than the gate region.

4. The method of claim 1, wherein the step of forming the gate dielectric layer on top of the semiconductor channel region comprises the step of thermally oxidizing surfaces of the semiconductor substrate exposed to the atmosphere.

5. The method of claim 1, wherein the dielectric side plate material comprises a low-K material.

6. The method of claim 1, wherein the mandrel comprises silicon dioxide, and wherein the gate spacers comprise silicon nitride.

7. The method of claim 1, wherein the step of forming the gate stack comprises the steps of:
forming a gate region layer on top of the gate dielectric layer, wherein the gate region layer comprises the gate region;
forming the gate stack mask on top of the gate region layer; and
using the gate stack mask as a mask to etch away portions of the gate region layer not covered by the gate stack mask so as to form the gate region.

8. The method of claim 7, wherein the step of forming gate stack mask on top of the gate region layer comprises the steps of:
forming a gate mandrel layer on top of the gate region layer, wherein the gate mandrel layer comprises the gate mandrel;
patterning the gate mandrel layer so as to form the gate mandrel; and
depositing a gate spacer material on top of the entire semiconductor structure and then etching back so as to form the first and second gate spacers on side walls of the gate mandrel.

9. The method of claim 1, wherein the step of forming the first and second source/drain regions comprises the step of doping by ion implantation the semiconductor substrate so as to form the first and second source/drain regions in the semiconductor substrate.

10. The method of claim 9, wherein the step of forming the first and second source/drain regions further comprises the step of epitaxially growing a semiconductor material on top of exposed surfaces of the semiconductor substrate before the step of doping by ion implantation the semiconductor substrate.

11. The method of claim 1, further comprising the step of removing the gate mandrel before the step of removing the first and second gate spacers.

12. The method of claim 1, wherein the step of removing the first and second gate spacers comprises the steps of:
removing the gate mandrel;
depositing a dielectric material on top of the entire semiconductor structure;
planarizing a top surface of the semiconductor structure so as to expose top surfaces of the first and second gate spacers to the atmosphere; and
etching away the first and second gate spacers.

13. The method of claim 1, wherein the step of removing the portions of the gate region beneath the removed first and second gate spacers comprises the step of etching vertically downward the empty space of the removed first and second gate spacers.

14. A method for fabricating a semiconductor structure, the method comprising the steps of;
(a) providing a semiconductor channel region in a semiconductor substrate;
(b) forming a gate dielectric layer on top of the semiconductor channel region;
(c) forming a gate stack on top of the gate dielectric layer,
wherein the gate stack is electrically isolated from the semiconductor channel region by the gate dielectric layer,
wherein the gate stack comprises (i) a gate region on top of the gate dielectric layer, and (ii) and a gate stack mask on top of the gate region,
wherein the gate stack mask comprises a gate mandrel and first and second gate spacers, and
wherein the gate mandrel is sandwiched between the first and second gate spacers;
(d) removing the first and second gate spacers;
(e) removing portions of the gate region beneath the removed first and second gate spacers; and
(f) filling a dielectric side plate material into spaces of the removed first and second gate spacers and the removed portions of the gate region beneath the removed first and second gate spacers so as to form first and second gate dielectric side plates.

15. The method of claim 14, wherein the semiconductor channel region comprises a fin region formed on top of a buried dielectric layer.

16. The method of claim 14, wherein the semiconductor channel region is at a lower level than the gate region.

17. A semiconductor structure, comprising:
(a) a substrate;
(b) a semiconductor channel region on the substrate;
(c) a gate dielectric region on the semiconductor channel region;
(d) a gate electrode region on the gate dielectric region and electrically insulated from the semiconductor channel region by the gate dielectric region;
(e) a gate mandrel on the gate electrode region; and
(f) first and second gate spacers on the gate electrode region,
wherein the gate mandrel is sandwiched between the first and second gate spacers, wherein a first side wall of the first gate spacer is essentially aligned with a second side wall of the gate electrode region, and wherein a third side wall of the second gate spacer is essentially aligned with a fourth side wall of the gate electrode region.

18. The structure of claim 17, wherein the semiconductor channel region comprises a fin region formed on a buried dielectric layer of the substrate.

19. The structure of claim 17, wherein the first and second gate spacers comprise a nitride material, wherein the gate mandrel comprises an oxide material.

20. The structure of claim 17, wherein the gate mandrel is in direct physical contact with the first and second gate spacers.

* * * * *